(12) United States Patent
Punsalan et al.

(10) Patent No.: US 7,071,121 B2
(45) Date of Patent: Jul. 4, 2006

(54) PATTERNED CERAMIC FILMS AND METHOD FOR PRODUCING THE SAME

(75) Inventors: David Punsalan, Eugene, OR (US); Dennis M. Lazaroff, Corvallis, OR (US); Christopher C. Beatty, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 119 days.

(21) Appl. No.: 10/695,306

(22) Filed: Oct. 28, 2003

(65) Prior Publication Data

US 2005/0089733 A1 Apr. 28, 2005

(51) Int. Cl.
*H10L 21/31* (2006.01)
*H10L 21/469* (2006.01)

(52) U.S. Cl. .................. 438/778; 438/681; 438/950

(58) Field of Classification Search ................ 438/648, 438/652, 674, 681, 687, 778, 782, 799, 950
See application file for complete search history.

(56) References Cited

U.S. PATENT DOCUMENTS

| | | | |
|---|---|---|---|
| 4,248,921 A * | 2/1981 | Steigerwald et al. ........ 428/148 |
| 4,952,556 A | 8/1990 | Mantese et al. | |
| 5,021,398 A | 6/1991 | Sharma et al. | |
| 5,262,392 A | 11/1993 | Hung et al. | |
| 5,916,733 A | 6/1999 | Koyama | |
| 5,942,376 A | 8/1999 | Uchida et al. | |
| 6,177,357 B1 * | 1/2001 | Lu .......................... 438/745 |
| 6,194,129 B1 * | 2/2001 | Kasono et al. ............. 430/320 |
| 6,274,063 B1 * | 8/2001 | Li et al. ................... 252/79.1 |
| 6,284,314 B1 | 9/2001 | Kato et al. | |
| 6,352,763 B1 | 3/2002 | Dillon et al. | |
| 6,399,282 B1 | 6/2002 | Kubota et al. | |
| 6,565,763 B1 * | 5/2003 | Asakawa et al. ............. 216/56 |
| 6,571,384 B1 | 5/2003 | Shin et al. | |
| 2002/0083863 A1 | 7/2002 | Mitamura | |
| 2003/0113657 A1 | 6/2003 | Nagahara et al. | |
| 2003/0157250 A1 | 8/2003 | Mukherjee | |

FOREIGN PATENT DOCUMENTS

EP 0 296 719 12/1988

* cited by examiner

*Primary Examiner*—Phuc T. Dang

(57) ABSTRACT

A ceramic film is useful as ion-conducting ceramics, electrodes, hard ceramic coatings, transparent conducting oxides, transparent semiconducting oxides, ferroelectric oxides, and dielectric oxides. The ceramic film may be produced from a liquid precursor solution.

55 Claims, 4 Drawing Sheets

↓

FIRED

↓

FIRED

PATTERNED CERAMIC FILMS AND METHOD FOR PRODUCING THE SAME

BACKGROUND

Fuel cells use an electrochemical energy conversion of fuel (including but not limited to hydrogen, propane, methane, carbon monoxide, and the like) and oxidant(s) into electricity and heat. It is anticipated that fuel cells may be able to replace primary and secondary batteries as a portable power supply. In fuel cells, the fuel (usually containing a source of hydrogen) is oxidized typically with a source of oxygen to produce (primarily) water and carbon dioxide. The oxidation reaction at the anode, which liberates electrons, in combination with the reduction reaction at the cathode, which consumes electrons, results in a useful electrical voltage and current through the load.

As such, fuel cells provide a direct current (DC) voltage that may be used to power motors, lights, electrical appliances, etc. A solid oxide fuel cell (SOFC) is one type of fuel cell that may be useful in portable applications. The material properties, which are generally desirable for obtaining high performing fuel cell devices, also make fabrication of those fuel cell devices a significant challenge.

BRIEF DESCRIPTION OF THE DRAWINGS

In the drawings, like reference numerals correspond to similar, though not necessarily identical components. For the sake of brevity, reference numerals having a previously described function may not necessarily be described in connection with subsequent drawings in which they appear.

DETAILED DESCRIPTION OF THE EMBODIMENTS

It was discovered that novel patterned ceramic films may be made relatively simply, quickly, and efficiently through use of a liquid precursor solution in conjunction with patterning and heating techniques. These patterned ceramic films may be used in various applications, including ion-conducting ceramics, patterned electrodes in fuel cells, hard ceramic coatings, transparent conducting oxides, and transparent semiconducting oxides.

Figure 1A:
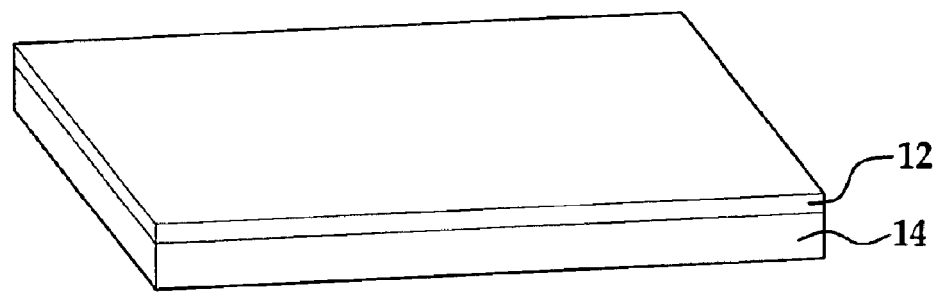
FIG. 1A is a perspective front view of an embodiment of the present invention, showing an embodiment of a liquid film deposited on an embodiment of a substrate.

Referring now to FIG. 1A, an embodiment for making a patterned ceramic film includes the step of depositing a liquid precursor solution onto a substrate 14 to form a liquid film 12.

It is to be understood that any suitable material may be chosen for the substrate 14. In an embodiment, the substrate 14 is single crystal silicon, polycrystalline silicon, silicon oxide containing dielectric substrates, alumina, sapphire, ceramic, and/or mixtures thereof. In an alternate embodiment of the present invention, a silicon wafer is the substrate 14 of choice.

In an embodiment, the liquid precursor solution is made by dissolving one or more metal salts in a photoresist. It is to be understood that any suitable metal salt(s) (non-limitative examples of the salt component of the metal salt(s) include nitrates, sulfates, and/or chlorides) may be chosen that do not overly contaminate the patterned ceramic film as observed by desired electrical, chemical, and/or mechanical performance, and/or reliability. In an embodiment, the metal salts are cerium nitrate and/or samarium nitrate.

Many metal salts are soluble in water. Therefore, dissolution of the metal salts would be easily achieved if a water-soluble photoresist were used. However, most photoresists are not water-soluble. It is to be understood that the photoresist may act as a carrier for the metal salt(s).

It is to be understood that some standard photoresists used in photolithography may, in some instances, not be suitable in embodiment(s) of the method. It is to be understood that replacing the photoresists useful for embodiments of the present invention with conventional photoresists may, in some instances, not result in a suitable ceramic film after heating. Without being bound to any theory, it is believed that a desirable photoresist will possess functional groups capable of stabilizing the metal cation to promote a substantially homogeneous liquid precursor solution. One non-limitative example of a suitable photoresist is one which has ketone groups on the ends of the repeat unit which may act to coordinate the metal cation. A non-limitative example of photoresists suitable for embodiments of the present invention include diacrylates. In an embodiment, the photoresist is tetra-ethlyene glycol diacrylate, polyvinylphenol (PVP), poly(4-vinylphenol), poly(4-hydroxystyrene), and/or any DNQ (diazonaphthoquinone)-Novolak based resist.

It is to be understood that the amount of metal salt(s) used depends upon the chosen metal salt and its solubility. In an embodiment, the concentration of metal salt to photoresist may be up to about 5 moles of metal per liter of photoresist.

It is to be understood that the liquid precursor solution is a true solution of the metal salts substantially fully dissolved in the photoresist. In order to obtain a fully miscible liquid precursor solution, the solution may be mixed until substantially all of the solids are dissolved into the photoresist. A fully miscible solution generally has no powder particles therein. Such a fully miscible solution may be advantageous for many reasons, for example, when the line-widths to be patterned are equal to or smaller than the size of the powder particles.

Generally, the time it takes to substantially fully dissolve the metal salts into the photoresist depends on the materials used. In an embodiment of the present invention, the total dissolution time is about two hours. If the metal salts are not substantially completely dissolved, the resulting liquid film 12 may possess undesirable heterogeneous properties.

In an embodiment of the present invention, one or more additives may optionally be mixed into the liquid precursor solution before it is deposited on the substrate 14. The addition of additives may assist in the thermal and ultraviolet curing of the liquid precursor solution after it is applied to the substrate 14. It is to be understood that any suitable additives may be chosen. In an embodiment, suitable photoinitiator additives include, but are not limited to 2,5 dimethyl 2,5-di-t-butylperoxy hexane (commercially available under the tradename LUPEROX 101 from ATOFINA Chemicals Inc. in Philadelphia, Pa.), alpha, alpha-dimethoxy-alpha-phenylacetophenone (commercially available under the tradename IRGACURE 651 from Ciba Specialty Chemicals in Terrytown, N.Y.), and/or mixtures thereof.

In an embodiment of the present invention, the liquid precursor solution is deposited onto the substrate 14 using deposition techniques including, but not limited to, spin coating, screen printing, dip coating, meniscus coating, and spray coating. Spin coating generally forms very thin film thicknesses and small, intricate geometries. In an embodiment, the thin film thicknesses are less than or equal to about 1 μm. Screen printing generally forms thicker film thicknesses and larger geometries. In an alternate embodiment, the thicker film thicknesses are greater than or equal to about 10 μm.

In an embodiment, the liquid film 12 ranges in thickness from about 0.05 μm to about 0.5 μm. In an alternate embodiment, the liquid film 12 has a thickness of about 0.25 μm.

It is to be understood that a thicker liquid film 12 according to an embodiment of the present invention may be formed by depositing multiple layers 12 of the liquid precursor solution onto the substrate 14.

Figure 1B:
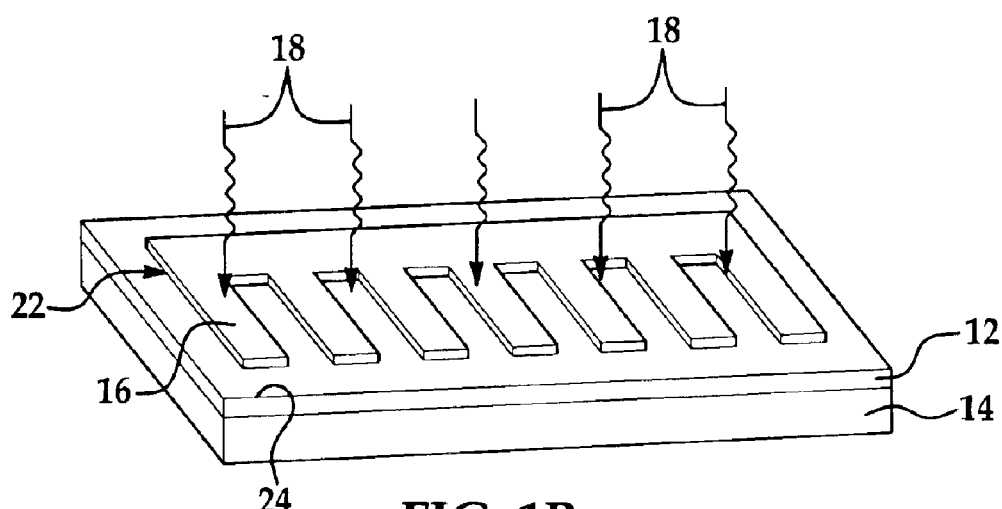
FIG. 1B is a view similar to FIG. 1A, showing an embodiment of a mask on a predetermined portion of an embodiment of the liquid film.

Now referring to FIG. 1B, the method of the embodiment of the present invention further includes the step of patterning the liquid film 12. It is to be understood that liquid film 12 may be patterned into any suitable shape, size and/or configuration.

Any applicable negative or positive photolithography technique may be selected to pattern the liquid film 12.

In an embodiment, patterning includes the step of masking a portion of the liquid film 12. A mask 16 is placed over the liquid film 12 such that one portion 22 of the liquid film 12 is masked and another portion 24 of the liquid film 12 is unmasked.

The patterning step further includes the step of exposing the liquid film 12, with the mask 16 thereon, to a light source 18. It is to be understood that any suitable light source 18 may be used. In an embodiment of the present invention, a UV lamp (365 nm 200 W/lin. in) is exposed to the liquid film 12. The light source 18 cures either the masked 22 or the unmasked 24 portion of the liquid film 12 (depending upon whether positive or negative photolithography is used).

FIG. 1B shows a non-limitative example of an embodiment of the present invention whereby a positive photolithography technique is used. With this technique, the masked portion 22 of the liquid film 12 is cured, and the unmasked portion 24 of the liquid film 12 is uncured.

In an embodiment of the present invention, after the liquid film 12 is exposed to the light source 18, the method may further optionally include the step of baking the liquid film 12. It is to be understood that this post-exposure bake may be a low temperature bake. In an embodiment, the bake temperature ranges between about 50° C. and about 250° C. In an alternate embodiment, the bake temperature is about 100° C.

Figure 1C:
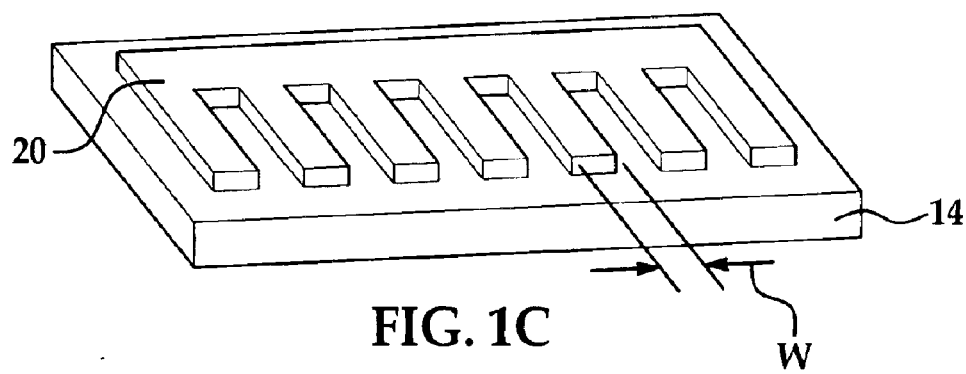
FIG. 1C is a view similar to FIG. 1A, showing an embodiment of a patterned liquid film.

Referring now to FIG. 1C, in an embodiment of the method of the present invention, the patterning step further includes the step of removing the uncured portion of the liquid film 12, leaving the patterned liquid film 20. It is to be understood that removal of the uncured portion of the liquid film 12 may be accomplished by any suitable means, including but not limited to solvent stripping. In an embodiment, removal occurs by dissolving the uncured portion of the liquid film 12 in isopropyl alcohol.

In an embodiment, the method includes the step of heating the patterned liquid film 20 to drive off the organics that remain from the liquid precursor solution. It is to be understood that any suitable heat treatment may be chosen. In an embodiment, the patterned liquid film 20 is fired at temperatures ranging between about 550° C. and about 600° C. In a further embodiment, the firing temperature ranges between about 540° C. and about 1050° C. It is to be understood that, in some instances, higher temperatures may aid in removing contamination, and/or achieving the desired morphology or phase of the patterned ceramic film 10.

It is to be understood that the line width W of the patterned liquid film 20 may be any suitable width; however in an embodiment, the width ranges between about 0.5 μm to about 2 mm.

Embodiment(s) of the patterned ceramic film 10 may have thicknesses ranging between about 0.2 μm and about 0.3 μm. It is to be understood that patterned ceramic films 10 having thicknesses in this range are substantially crack free.

Figure 2A:
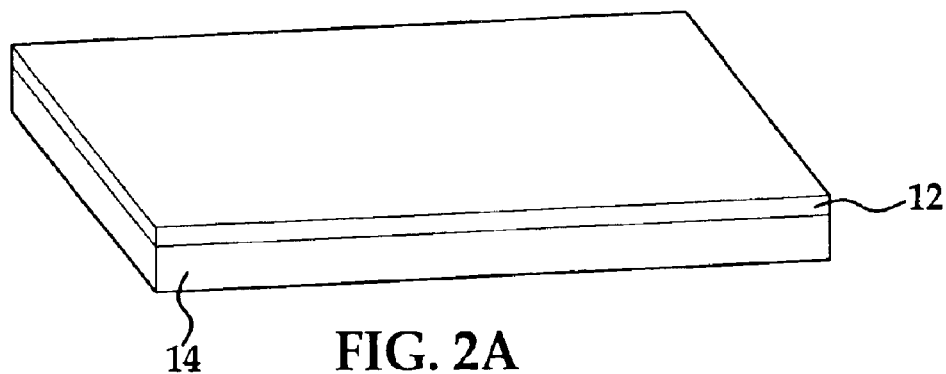
FIG. 2A is a perspective front view of an alternate embodiment of the present invention, showing an embodiment of a liquid film deposited on an embodiment of a substrate.
Figure 2B:
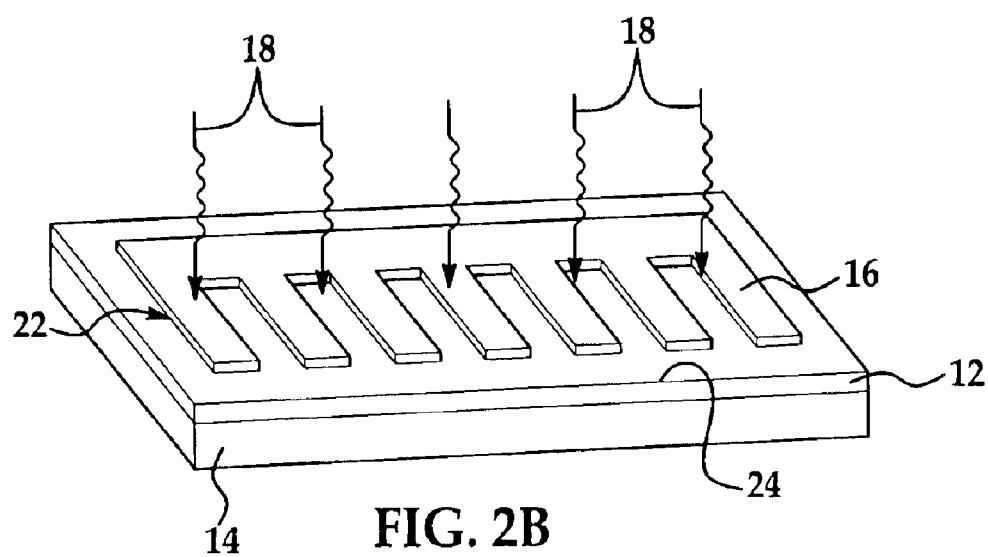
FIG. 2B is a view similar to FIG. 2A, showing an embodiment of a mask on a predetermined portion of an embodiment of the liquid film.
Figure 2C:
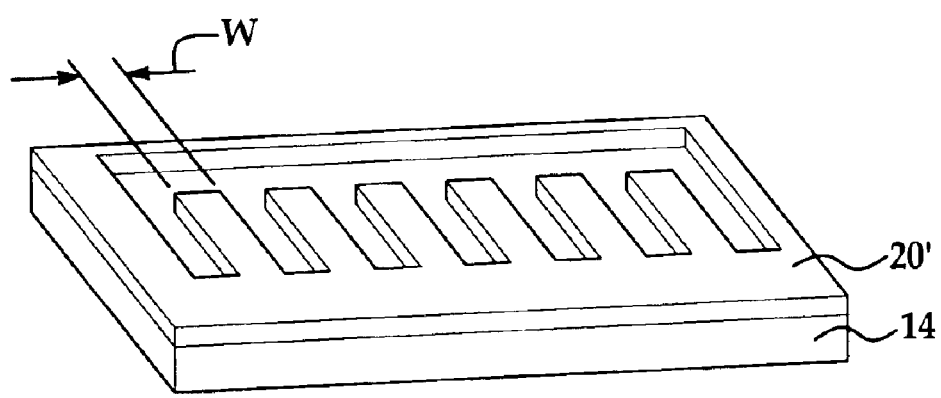
FIG. 2C is a view similar to FIG. 2A, showing an embodiment of the patterned liquid film.

Referring now to FIGS. 2A through 2C, an embodiment for making a patterned ceramic film 10 includes the steps as described hereinabove in relation to FIGS. 1A through 1C. In contrast, however, referring particularly to FIG. 2B, the patterning step uses a negative photolithography technique. A mask 16 is placed over a portion of the liquid film 12 such that a portion 22 of the liquid film 12 is masked and a portion 24 of the liquid film 12 is unmasked.

In this embodiment using negative photolithography, the masked portion 22 is uncured, and the unmasked portion 24 of the liquid film 12 is cured.

Referring now to FIG. 2C, the method of the embodiment of the present invention further includes the step of removing the uncured portion 24 of the liquid film 12. FIG. 2C shows an alternate embodiment of the present invention wherein the patterned liquid film 20' is a reverse configuration of the mask 16 used (shown in FIG. 2B).

To further illustrate, the following example is given. It is to be understood that this example is provided for illustrative purposes and is not to be construed as limiting the scope of the claimed subject matter.

EXAMPLE 6.94 g of cerium nitrate and 1.78 g of samarium nitrate were added to 40 cc of tetra-ethylene glycol diacrylate to form the liquid precursor solution. 5 cc of LUPEROX™ photoinitiator and 5% by weight of IRGACURE 651 were added to the liquid precursor solution to assist in thermal and ultraviolet curing. The solution was mixed for about 2 hours so that the mixture was completely dissolved and a clear solution was obtained.

The liquid precursor solution was then spin coated onto a silicon wafer. Shadow masking and ultraviolet exposure were used to pattern the liquid film. After exposure, the uncured portion of the patterned liquid film was removed with isopropyl alcohol. The patterned liquid film was then fired at about 540° C. to remove the organic portion of the liquid precursor solution and to leave the desired samarium doped ceria (SDC) patterned ceramic film. This SDC patterned film may be suitable for use as an anode in a fuel cell (for example, in a solid oxide fuel cell (SOFC)).

Figure 3:
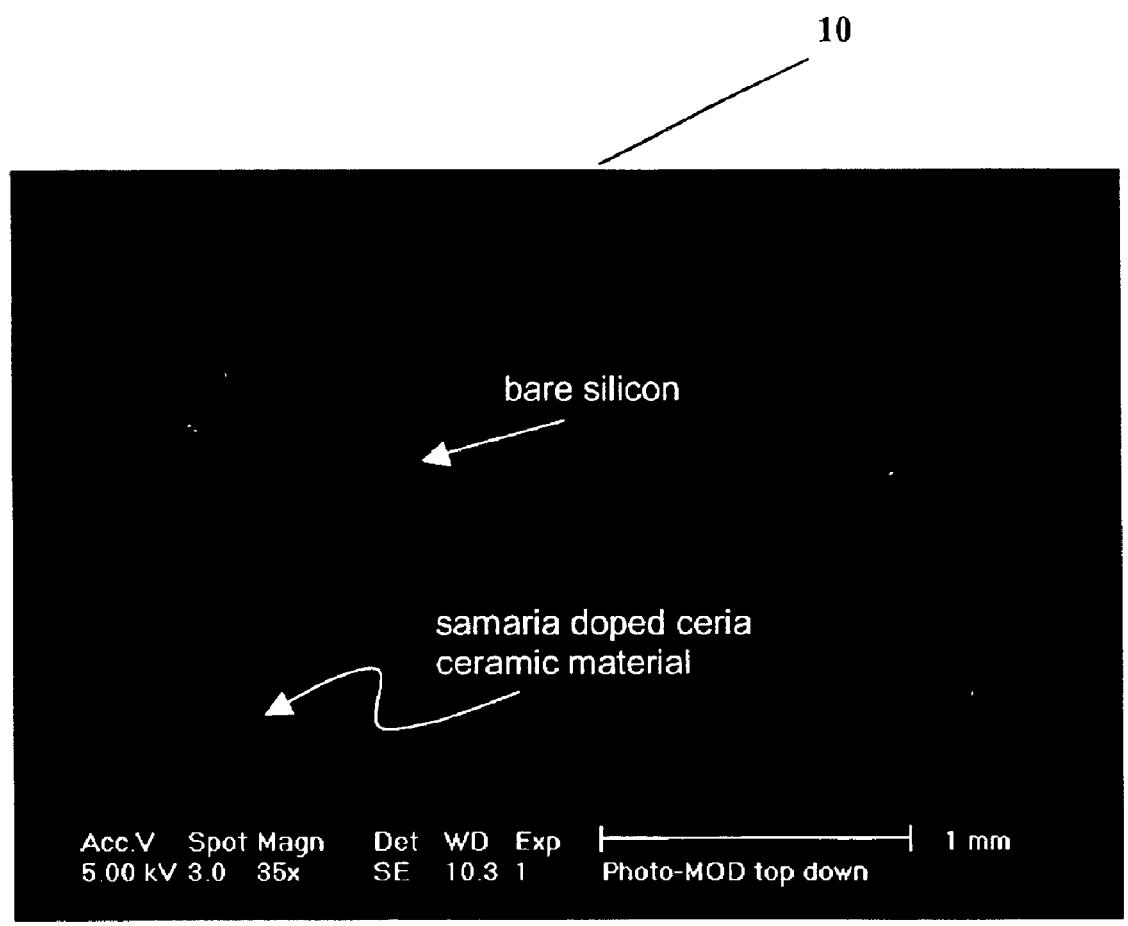
FIG. 3 is a scanning electron micrograph (SEM) at 35× magnification showing a top view of an embodiment of a patterned ceramic film according to an embodiment of the present invention.

Referring now to FIG. 3, a SEM at 35× magnification of a top view of the resultant SDC patterned ceramic film is shown.

It is to be understood that the embodiments of the patterned ceramic films may be used in a variety of applications, including, but not limited to, ion-conducting ceramics (for example, electrolytes), hard ceramic coatings, transparent conducting oxides (a non-limitative embodiment of which is indium tin oxide) and transparent semiconducting oxides (a non-limitative example of which is zinc oxide), ferroelectric oxides (a non-limitative example of which is lead zirconate titanate), dielectric oxides (non-limitative examples of which include aluminum oxides and zirconium oxides), and as anodes and cathodes. The electrolytes, anodes and cathodes may be suitable for use in fuel cells.

Figure 4:
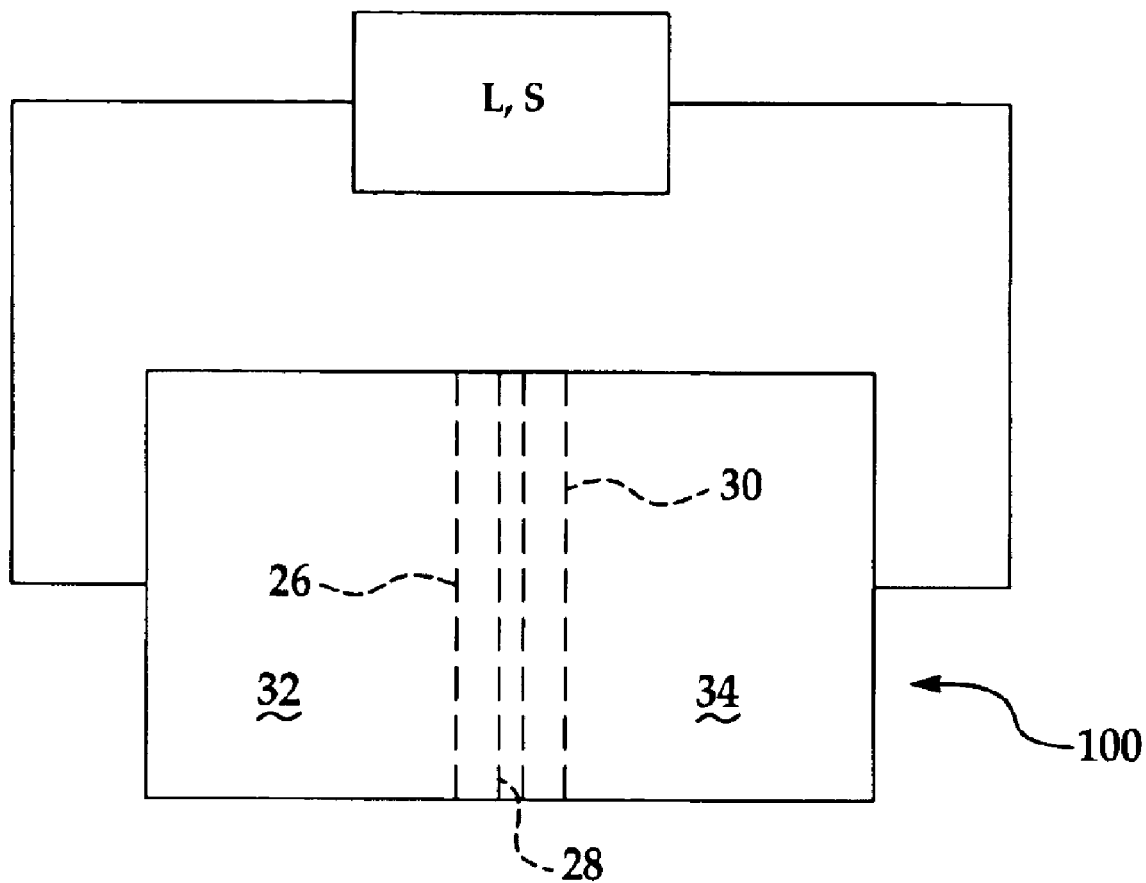
FIG. 4 is a schematic view of an embodiment of the fuel cell according to an embodiment of the present invention.

Referring now to FIG. 4, in an embodiment of the present invention, a fuel cell 100 includes at least one electrode 26, 30 in electrochemical contact with an electrolyte 28. It is to be understood that the electrode 26, 30 may be an anode 26 or a cathode 30. It is to be further understood that the electrolyte 28, the anode 26, and/or the cathode 30 may be a patterned ceramic film 10 according to embodiment(s) of the present invention.

FIG. 4 is a simplified schematic diagram of a dual chamber fuel cell 100. It is to be understood that fuel cell 100 may also be a single chamber fuel cell.

Further, it is to be understood that the fuel cell 100 may be one of solid oxide fuel cells, proton conducting ceramic fuel cells, Polymer Electrolyte Membrane (PEM) fuel cells, molten carbonate fuel cells, solid acid fuel cells, and Direct Methanol PEM fuel cells.

In the fuel cell 100 embodiments of the present invention, oxidants 34 are carried to the cathode 30, and reactants 32 are carried to the anode 26. In an embodiment, the reactants 32 are fuels, and the oxidants 34 are one of oxygen, air, and mixtures thereof. It is to be understood that any suitable fuel/reactant 32 may be used with the fuel cell 100. In an embodiment, the fuel/reactant 32 is selected from at least one of hydrogen, methane, ethane, propane, butane, pentane, methanol, ethanol, higher straight chain or mixed hydrocarbons, for example, natural gas or gasoline (low sulfur hydrocarbons may be desirable, e.g. low sulfur gasoline, low sulfur kerosene, low sulfur diesel), and mixtures thereof. In an alternate embodiment, the fuel/reactant 32 is selected from the group consisting of butane, propane, methane, pentane, and mixtures thereof. Suitable fuels may be chosen for their suitability for internal direct reformation, suitable vapor pressure within the operating temperature range of interest, and like parameters.

It is to be understood that if fuel cell 100 is a single chamber fuel cell, a gaseous mixture of reactant 32 and oxidant 34 may be directed toward the anode 26 and/or the cathode 30.

An embodiment of a method of using fuel cell 100 includes the step of operatively connecting the fuel cell 100 to electrical load L and/or to electrical storage device S. The electrical load L may include many devices, including, but not limited to any or all of computers, portable electronic appliances (e.g. portable digital assistants (PDAs), portable power tools, etc.), and communication devices, portable or otherwise, both consumer and military. The electrical storage device S may include, as non-limitative examples, any or all of capacitors, batteries, and power conditioning devices. Some exemplary power conditioning devices include uninterruptible power supplies, DC/AC converters, DC voltage converters, voltage regulators, current limiters, etc.

It is also contemplated that the fuel cell 100 may, in some instances, be suitable for use in the transportation industry, e.g. to power automobiles, and in the utilities industry, e.g. within power plants.

An embodiment of a method of using a patterned ceramic film 10 includes the step of operatively disposing the patterned ceramic film 10 in a device. It is to be understood that any suitable device may be chosen such that the patterned ceramic film 10 is adapted to be used as an ion-conducting ceramic, an electrode, hard ceramic coatings, transparent conducting oxides, transparent semiconducting oxides, ferroelectric oxides, and/or dielectric oxides.

Embodiments of the present invention may provide many advantages, examples of which include, but are not limited to the following. Embodiments of the present invention may advantageously provide a method of making patterned ceramic films while generally avoiding having to pattern the hard and brittle ceramic film. Further, embodiments of the patterned ceramic film 10 may be advantageously used as ion-conducting ceramics, electrodes, hard ceramic coatings, transparent conducting oxides, transparent semiconducting oxides, ferroelectric oxides, and/or dielectric oxides.

While several embodiments of the present invention have been described in detail, it will be apparent to those skilled in the art that the disclosed embodiments may be modified. Therefore, the foregoing description is to be considered exemplary rather than limiting, and the true scope is that defined in the following claims.

What is claimed is:

1. A method of making a patterned ceramic film, comprising:

depositing a liquid precursor solution onto a substrate, thereby forming a liquid film, the liquid precursor solution having at least one soluble metal salt dissolved into a photoresist;

patterning the liquid film; and heating the patterned liquid film, thereby producing the patterned ceramic film;

wherein the patterned ceramic film is adapted for use as at least one of ion-conducting ceramics, electrodes, hard ceramic coatings, transparent conducting oxides, transparent semiconducting oxides, ferroelectric oxides, or dielectric oxides.

2. The method as defined in claim 1 wherein the at least one soluble inorganic metal salt includes a metal cation and a salt anion, and wherein the salt anion is selected from nitrates, sulfates, chlorides, and mixtures thereof.

3. The method as defined in claim 2 wherein the at least one soluble metal salt is selected from cerium nitrate, samarium nitrate, and combinations thereof.

4. The method as defined in claim 1 wherein the at least one soluble metal salt is substantially completely dissolved into the photoresist, and wherein the liquid precursor solution is substantially fully miscible.

5. The method as defined in claim 1 wherein at least one additive is mixed into the liquid precursor solution.

6. The method as defined in claim 5 wherein the at least one additive is selected from 2,5 dimethyl 2,5-di-t-butylperoxy hexane and alpha, alpha-dimethoxy-alpha-phenylacetophenone, and mixtures thereof.

7. The method as defined in claim 1 wherein the photoresist is selected from diacrylates, polyvinylphenol (PVP), poly(4-vinylphenol), poly(4-hydroxystyrene), DNQ (diazonaphthoquinone)-Novolaks, and mixtures thereof.

8. The method as defined in claim 1 wherein the liquid film ranges in thickness between about 0.05 μm and about 0.5 μm.

9. The method as defined in claim 1 wherein the patterned ceramic film has a thickness ranging between about 0.2 μm and about 0.3 μm.

10. The method as defined in claim 1 wherein patterning comprises:
   masking a predetermined portion of the liquid film, wherein the liquid film has a masked portion and an unmasked portion;
   exposing the liquid film to a light source, whereby one of the masked portion and the unmasked portion is cured; and
   removing the uncured portion.

11. The method as defined in claim 10, further comprising baking the exposed liquid film before removing the uncured portion.

12. The method as defined in claim 11 wherein the bake temperature ranges between about 50° C. and about 250° C.

13. The method as defined in claim 12 wherein the bake temperature is about 100° C.

14. The method as defined in claim 10 wherein the removing is accomplished by solvent stripping.

15. The method as defined in claim 14 wherein the removing is accomplished by dissolving the uncured portion of the liquid film in isopropyl alcohol.

16. The method as defined in claim 1 wherein heating is accomplished by firing the patterned liquid film.

17. The method as defined in claim 16 wherein firing temperatures range between about 540° C. and about 1050° C.

18. The method as defined in claim 16 wherein firing temperatures range between about 550° C. and about 600° C.

19. The method as defined in claim 1 wherein the substrate is selected silicon, single crystal silicon, polycrystalline silicon, silicon oxide containing dielectric substrates, alumina, sapphire, ceramic, and mixtures thereof.

20. The method as defined in claim 1 wherein the depositing is accomplished by one of spin coating, screen printing, dip coating, meniscus coating, or spray coating.

21. The method as defined in claim 1 wherein the patterned ceramic film has a line width, the line width ranging between about 0.5/m to about 2 mm.

22. A patterned ceramic film produced by the process of claim 1.

23. A fuel cell, comprising:
   at least one electrode operatively disposed in the fuel cell; and
   an electrolyte in electrochemical contact with the at least one electrode;
   wherein at least one of the electrode or the electrolyte comprises a patterned ceramic film produced by the process comprising:
      depositing a liquid precursor solution onto a substrate, thereby forming a liquid film, the liquid precursor solution having at least one soluble metal salt dissolved into a photoresist;
      patterning the liquid film; and
      heating the patterned liquid film, thereby producing the patterned ceramic film.

24. The fuel cell as defined in claim 23 wherein the at least one soluble metal salt is selected from cerium nitrate, samarium nitrate and combinations thereof.

25. The fuel cell as defined in claim 23 wherein the at least one soluble metal salt is substantially completely dissolved into the photoresist, and wherein the liquid precursor solution is substantially fully miscible.

26. The fuel cell as defined in claim 23 wherein at least one additive is mixed into the liquid precursor before the liquid precursor is deposited on the substrate.

27. The fuel cell as defined in claim 26 wherein the additive is selected from 2,5 dimethyl 2,5-di-t-butylperoxy hexane alpha, alpha-dimethoxy-alpha-phenylacetophenone, and mixtures thereof.

28. The fuel cell as defined in claim 23 wherein the electrode is selected from an anode and a cathode.

29. The fuel cell as defined in claim 23 wherein the photoresist is tetraethylene glycol diacrylate.

30. The fuel cell as defined in claim 23 wherein the patterned ceramic film ranges in thickness between about 0.2 μm and about 0.3 μm.

31. The fuel cell as defined in claim 23 wherein the liquid film ranges in thickness between about 0.05 μm and about 0.5 μm.

32. The fuel cell as defined in claim 23 wherein patterning comprises:
   masking a predetermined portion of the liquid film, wherein the liquid film has a masked portion and an unmasked portion;
   exposing the liquid film to a light source, whereby one of the masked portion and the unmasked portion is cured; and
   removing the uncured portion.

33. The fuel cell as defined in claim 32, further comprising baking the exposed liquid film before removing the uncured portion.

34. The fuel cell as defined in claim 33 wherein the bake temperature ranges between about 50° C. and about 250° C.

35. The fuel cell as defined in claim 34 wherein the bake temperature is about 100° C.

36. The fuel cell as defined in claim 32 wherein the removing is accomplished by solvent stripping.

37. The fuel cell as defined in claim 36 wherein the removing is accomplished by dissolving the uncured portion of the liquid film in isopropyl alcohol.

38. The fuel cell as defined in claim 23 wherein the heating is accomplished by firing the patterned liquid film.

39. The fuel cell as defined in claim 38 wherein firing temperatures range between about 540° C. to about 1050° C.

40. The fuel cell as defined in claim 23 wherein the substrate is selected from silicon, single crystal silicon, polycrystalline silicon, silicon oxide containing dielectric substrates, alumina, sapphire, ceramic, and mixtures thereof.

41. An electronic device, comprising:
   a load; and
   the fuel cell of claim 23 connected to the load.

42. A method of using a patterned ceramic film, the patterned ceramic film having been formed by a process comprising:
   depositing a liquid precursor solution onto a substrate, thereby forming a liquid film, the liquid precursor solution having at least one soluble metal salt dissolved into a photoresist;
   patterning the liquid film; and
   heating the patterned liquid film, thereby producing the patterned ceramic film;
   wherein the method of using the patterned ceramic film comprises operatively disposing the patterned ceramic film in a device, wherein the patterned ceramic film is at least one of an ion-conducting ceramic, an electrode, a hard ceramic coating, a transparent conducting oxide, a transparent semiconducting oxide, a ferroelectric oxide, or a dielectric oxide.

43. A method of using a fuel cell, comprising:

operatively connecting the fuel cell to a load, wherein the fuel cell comprises at least one of an electrode or an electrolyte comprising a patterned ceramic film formed by a process comprising:
- depositing a liquid precursor solution onto a substrate, thereby forming a liquid film, the liquid precursor solution having at least one soluble metal salt dissolved into a photoresist;
- patterning the liquid film; and
- heating the patterned liquid film, thereby producing the patterned ceramic film.

44. The method as defined in claim 43 wherein the electrode is selected from an anode and a cathode.

45. A ceramic film, comprising:

a metal-organic liquid precursor solution having a pattern; and means for converting the precursor solution into the ceramic film having the pattern therein, wherein the ceramic film is adapted for use as at least one of ion-conducting ceramics, electrodes, hard ceramic coatings, transparent conducting oxides, transparent semiconducting oxides, ferroelectric oxides, or dielectric oxides.

46. A method of making a patterned ceramic film, comprising:

depositing a liquid precursor solution onto a substrate, thereby forming a liquid film, the liquid precursor solution having at least one soluble metal salt dissolved into a photoresist, wherein the at least one soluble metal salt is substantially completely dissolved into the photoresist, and wherein the liquid precursor solution is substantially fully miscible;

patterning the liquid film, wherein patterning comprises:
- masking a predetermined portion of the liquid film, wherein the liquid film has a masked portion and an unmasked portion;
- exposing the liquid film to a light source, whereby one of the masked portion and the unmasked portion is cured; and
- removing the uncured portion; and firing the patterned liquid film at a temperature sufficient to substantially drive off organic materials, thereby rendering the patterned ceramic film;

wherein the patterned ceramic film is adapted for use as at least one of ion-conducting ceramics, electrodes, hard ceramic coatings, transparent conducting oxides, transparent semiconducting oxides, ferroelectric oxides, or dielectric oxides.

47. The method as defined in claim 46 wherein the at least one soluble metal salt is selected from cerium nitrate and samarium nitrate, and combinations thereof.

48. The method as defined in claim 46 wherein the liquid film ranges in thickness between about 0.05 µm and about 0.5 µm.

49. The method as defined in claim 46 wherein the patterned ceramic film has a thickness ranging between about 0.2 µm and about 0.3 µm.

50. The method as defined in claim 1 wherein the photoresist is not water-soluble.

51. A method of making a patterned ceramic film, comprising:

depositing a liquid precursor solution onto a substrate, thereby forming a liquid film, the liquid precursor solution having at least one soluble inorganic metal salt dissolved into a photoresist;

patterning the liquid film; and heating the patterned liquid film, thereby producing the patterned ceramic film.

52. The method as defined in claim 51 wherein the at least one soluble inorganic metal salt includes a metal cation and a salt anion, and wherein the salt anion is selected from nitrates, sulfates, chlorides, and mixtures thereof.

53. A liquid precursor solution, comprising:

a photoresist; and at least one soluble inorganic metal salt dissolved in the photoresist;

wherein the liquid precursor solution is adapted to be converted into a ceramic film.

54. The liquid precursor solution as defined in claim 53 wherein the at least one soluble inorganic metal salt includes a metal cation and a salt anion, and wherein the salt anion is selected from nitrates, sulfates, chlorides, and mixtures thereof.

55. The liquid precursor solution as defined in claim 53 wherein the photoresist is not water soluble.

* * * * *